US011753727B2

(12) United States Patent
Britz et al.

(10) Patent No.: US 11,753,727 B2
(45) Date of Patent: Sep. 12, 2023

(54) PROTECTION OF COMPONENTS FROM CORROSION

(71) Applicant: Applied Materials, Inc., Santa Clara, CA (US)

(72) Inventors: David Britz, Los Gatos, CA (US); Pravin K. Narwankar, Sunnyvale, CA (US); David Thompson, San Jose, CA (US); Yuriy Melnik, San Jose, CA (US); Sukti Chatterjee, San Jose, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 299 days.

(21) Appl. No.: 17/313,863

(22) Filed: May 6, 2021

(65) Prior Publication Data

US 2021/0254223 A1  Aug. 19, 2021

Related U.S. Application Data

(62) Division of application No. 16/283,567, filed on Feb. 22, 2019, now Pat. No. 11,015,252.
(Continued)

(51) Int. Cl.
*C23C 16/40* (2006.01)
*C23C 28/00* (2006.01)
(Continued)

(52) U.S. Cl.
CPC .... *C23C 28/3455* (2013.01); *C23C 16/45525* (2013.01); *C23C 16/52* (2013.01);
(Continued)

(58) Field of Classification Search
CPC ................................ C23C 16/40; C23C 16/52
See application file for complete search history.

(56) References Cited

U.S. PATENT DOCUMENTS

| 4,698,130 A | 10/1987 | Restall et al. |
| 5,217,757 A | 6/1993 | Olson et al. |

(Continued)

FOREIGN PATENT DOCUMENTS

| CN | 203592733 | * 5/2014 | .............. B32B 7/02 |
| CN | 104647828 A | 5/2015 | |

(Continued)

OTHER PUBLICATIONS

Brzeszcz, Joanna, et al., "Corrosion inhibitors—application in oil industry". NAFTA-GAZ, ROK LXXI, Nr.Feb. 2015, pp. 1-9.*
(Continued)

*Primary Examiner* — Bret P Chen
(74) *Attorney, Agent, or Firm* — PATTERSON + SHERIDAN, LLP

(57) ABSTRACT

Using the systems and methods discussed herein, CMAS corrosion is inhibited via CMAS interception in an engine environment and/or is prevented or reduced by the formation of a metal oxide protective coating on a hot engine section component. The CMAS interception can occur while the engine is in operation in flight or in a testing or quality control environment. The metal oxide protective coating can be applied over other coatings, including Gd-zirconates (GZO) or yttria-stabilized zirconia (YSZ). The metal oxide protective coating is applied at original equipment manufacturers (OEM) and can also be applied in-situ using a gas injection system during engine use in-flight or during maintenance or quality testing. The metal oxide protective coating contains a rare earth element, aluminum, zirconium, chromium, or combinations thereof.

20 Claims, 6 Drawing Sheets

Related U.S. Application Data

(60) Provisional application No. 62/726,795, filed on Sep. 4, 2018, provisional application No. 62/663,633, filed on Apr. 27, 2018.

(51) Int. Cl.
  *F01D 5/28* (2006.01)
  *F01D 5/18* (2006.01)
  *C23C 16/455* (2006.01)
  *C23C 16/52* (2006.01)
  C23C 28/04 (2006.01)
  C23C 14/08 (2006.01)

(52) U.S. Cl.
  CPC ........ *C23C 28/3215* (2013.01); *C23C 28/345* (2013.01); *F01D 5/186* (2013.01); *F01D 5/288* (2013.01); C23C 14/083 (2013.01); C23C 16/40 (2013.01); C23C 28/042 (2013.01); F05D 2230/31 (2013.01); F05D 2240/24 (2013.01); F05D 2260/95 (2013.01); F05D 2300/121 (2013.01); F05D 2300/132 (2013.01); F05D 2300/134 (2013.01); Y10T 428/2462 (2015.01)

(56) References Cited

U.S. PATENT DOCUMENTS

| | | |
|---|---|---|
| 5,362,228 A | 11/1994 | Vaudel |
| 5,503,874 A | 4/1996 | Ackerman et al. |
| 5,950,925 A | 9/1999 | Fukunaga et al. |
| 6,042,898 A | 3/2000 | Burns et al. |
| 6,156,382 A | 12/2000 | Rajagopalan et al. |
| 6,162,715 A | 12/2000 | Mak et al. |
| 6,207,295 B1 | 3/2001 | Stowell et al. |
| 6,245,192 B1 | 6/2001 | Dhindsa et al. |
| 6,309,713 B1 | 10/2001 | Mak et al. |
| 6,332,926 B1 | 12/2001 | Pfaendtner et al. |
| 6,359,089 B2 | 3/2002 | Hung et al. |
| 6,379,466 B1 | 4/2002 | Sahin et al. |
| 6,402,898 B1 | 6/2002 | Brumer et al. |
| 6,437,066 B1 | 8/2002 | Hung et al. |
| 6,465,040 B2 | 10/2002 | Gupta et al. |
| 6,495,271 B1 | 12/2002 | Vakil |
| 6,551,929 B1 | 4/2003 | Kori et al. |
| 6,607,976 B2 | 8/2003 | Chen et al. |
| 6,620,670 B2 | 9/2003 | Song et al. |
| 6,620,723 B1 | 9/2003 | Byun et al. |
| 6,620,956 B2 | 9/2003 | Chen et al. |
| 6,630,244 B1 | 10/2003 | Mao et al. |
| 6,677,247 B2 | 1/2004 | Yuan et al. |
| 6,740,585 B2 | 5/2004 | Yoon et al. |
| 6,784,096 B2 | 8/2004 | Chen et al. |
| 6,797,340 B2 | 9/2004 | Fang et al. |
| 6,800,376 B1 | 10/2004 | Gupta et al. |
| 6,805,750 B1 | 10/2004 | Ristau et al. |
| 6,809,026 B2 | 10/2004 | Yoon et al. |
| 6,811,814 B2 | 11/2004 | Chen et al. |
| 6,821,891 B2 | 11/2004 | Chen et al. |
| 6,825,134 B2 | 11/2004 | Law et al. |
| 6,827,978 B2 | 12/2004 | Yoon et al. |
| 6,831,021 B2 | 12/2004 | Chua et al. |
| 6,833,161 B2 | 12/2004 | Wang et al. |
| 6,838,125 B2 | 1/2005 | Chung et al. |
| 6,846,516 B2 | 1/2005 | Yang et al. |
| 6,869,838 B2 | 3/2005 | Law et al. |
| 6,872,429 B1 | 3/2005 | Chen et al. |
| 6,905,939 B2 | 6/2005 | Yuan et al. |
| 6,911,391 B2 | 6/2005 | Yang et al. |
| 6,924,191 B2 | 8/2005 | Liu et al. |
| 6,936,538 B2 | 8/2005 | Byun |
| 6,939,801 B2 | 9/2005 | Chung et al. |
| 6,939,804 B2 | 9/2005 | Lai et al. |
| 6,949,342 B2 | 9/2005 | Golub et al. |
| 6,951,804 B2 | 10/2005 | Seutter et al. |
| 6,972,267 B2 | 12/2005 | Cao et al. |
| 7,011,947 B2 | 3/2006 | Golub et al. |
| 7,026,238 B2 | 4/2006 | Xi et al. |
| 7,041,335 B2 | 5/2006 | Chung |
| 7,049,226 B2 | 5/2006 | Chung et al. |
| 7,081,271 B2 | 7/2006 | Chung et al. |
| 7,101,795 B1 | 9/2006 | Xi et al. |
| 7,211,144 B2 | 5/2007 | Lu et al. |
| 7,211,508 B2 | 5/2007 | Chung et al. |
| 7,241,686 B2 | 7/2007 | Marcadal et al. |
| 7,244,683 B2 | 7/2007 | Chung et al. |
| 7,262,133 B2 | 8/2007 | Chen et al. |
| 7,264,846 B2 | 9/2007 | Chang et al. |
| 7,265,048 B2 | 9/2007 | Chung et al. |
| 7,279,432 B2 | 10/2007 | Xi et al. |
| 7,285,312 B2 | 10/2007 | Li |
| 7,317,229 B2 | 1/2008 | Hung et al. |
| 7,371,467 B2 | 5/2008 | Han et al. |
| 7,396,565 B2 | 7/2008 | Yang et al. |
| 7,404,985 B2 | 7/2008 | Chang et al. |
| 7,405,158 B2 | 7/2008 | Lai et al. |
| 7,416,979 B2 | 8/2008 | Yoon et al. |
| 7,429,402 B2 | 9/2008 | Gandikota et al. |
| 7,429,540 B2 | 9/2008 | Olsen |
| 7,439,191 B2 | 10/2008 | Law et al. |
| 7,473,655 B2 | 1/2009 | Wang et al. |
| 7,501,248 B2 | 3/2009 | Golub et al. |
| 7,507,660 B2 | 3/2009 | Chen et al. |
| 7,531,468 B2 | 5/2009 | Metzner et al. |
| 7,547,952 B2 | 6/2009 | Metzner et al. |
| 7,569,501 B2 | 8/2009 | Metzner et al. |
| 7,573,586 B1 | 8/2009 | Boyer et al. |
| 7,585,762 B2 | 9/2009 | Shah et al. |
| 7,595,263 B2 | 9/2009 | Chung et al. |
| 7,601,652 B2 | 10/2009 | Singh et al. |
| 7,651,955 B2 | 1/2010 | Ranish et al. |
| 7,732,327 B2 | 6/2010 | Lee et al. |
| 7,737,028 B2 | 6/2010 | Wang et al. |
| 7,776,395 B2 | 8/2010 | Mahajani |
| 7,816,200 B2 | 10/2010 | Kher |
| 7,824,743 B2 | 11/2010 | Lee et al. |
| 7,833,358 B2 | 11/2010 | Chu et al. |
| 7,846,840 B2 | 12/2010 | Kori et al. |
| 7,867,900 B2 | 1/2011 | Lee et al. |
| 7,875,119 B2 | 1/2011 | Gartland et al. |
| 7,910,165 B2 | 3/2011 | Ganguli et al. |
| 7,910,231 B2 | 3/2011 | Schuh et al. |
| 7,910,446 B2 | 3/2011 | Ma et al. |
| 7,964,505 B2 | 6/2011 | Khandelwal et al. |
| 7,972,978 B2 | 7/2011 | Mahajani |
| 8,043,907 B2 | 10/2011 | Ma et al. |
| 8,056,652 B2 | 11/2011 | Lockwood et al. |
| 8,227,078 B2 | 7/2012 | Morra et al. |
| 8,277,670 B2 | 10/2012 | Heo et al. |
| 8,470,460 B2 | 6/2013 | Lee |
| 8,721,812 B2 | 5/2014 | Furrer et al. |
| 8,741,420 B2 | 6/2014 | Bunker et al. |
| 8,871,297 B2 | 10/2014 | Barnett et al. |
| 9,255,327 B2 | 2/2016 | Winter et al. |
| 9,347,145 B2 | 5/2016 | Bessho |
| 9,683,281 B2 | 6/2017 | Meehan et al. |
| 9,777,583 B2 | 10/2017 | Leggett |
| 9,873,940 B2 | 1/2018 | Xu et al. |
| 10,072,335 B2 | 9/2018 | Marquardt et al. |
| 10,287,899 B2 | 5/2019 | Dierberger |
| 10,369,593 B2 | 8/2019 | Barnett et al. |
| 10,443,142 B2 | 10/2019 | Miettinen et al. |
| 10,488,332 B2 | 11/2019 | Kessler et al. |
| 10,633,740 B2 | 4/2020 | Melnik et al. |
| 11,028,480 B2 | 6/2021 | Knisley et al. |
| 2002/0002258 A1 | 1/2002 | Hung et al. |
| 2002/0045782 A1 | 4/2002 | Hung et al. |
| 2002/0117399 A1 | 8/2002 | Chen et al. |
| 2002/0127336 A1 | 9/2002 | Chen et al. |
| 2002/0136824 A1 | 9/2002 | Gupta et al. |
| 2003/0010451 A1 | 1/2003 | Tzu et al. |
| 2003/0057526 A1 | 3/2003 | Chung et al. |
| 2003/0059535 A1 | 3/2003 | Luo et al. |
| 2003/0059538 A1 | 3/2003 | Chung et al. |

(56) References Cited

U.S. PATENT DOCUMENTS

| | | |
|---|---|---|
| 2003/0072884 A1 | 4/2003 | Zhang et al. |
| 2003/0082301 A1 | 5/2003 | Chen et al. |
| 2003/0123216 A1 | 7/2003 | Yoon et al. |
| 2003/0124262 A1 | 7/2003 | Chen et al. |
| 2003/0132319 A1 | 7/2003 | Hytros et al. |
| 2003/0134300 A1 | 7/2003 | Golub et al. |
| 2003/0136520 A1 | 7/2003 | Yudovsky et al. |
| 2003/0139005 A1 | 7/2003 | Song et al. |
| 2003/0145875 A1 | 8/2003 | Han et al. |
| 2003/0152980 A1 | 8/2003 | Golub et al. |
| 2003/0157760 A1 | 8/2003 | Xi et al. |
| 2003/0172872 A1 | 9/2003 | Thakur et al. |
| 2003/0198754 A1 | 10/2003 | Xi et al. |
| 2003/0203616 A1 | 10/2003 | Chung et al. |
| 2003/0215570 A1 | 11/2003 | Seutter et al. |
| 2003/0235961 A1 | 12/2003 | Metzner et al. |
| 2004/0009665 A1 | 1/2004 | Chen et al. |
| 2004/0013803 A1 | 1/2004 | Chung et al. |
| 2004/0018738 A1 | 1/2004 | Liu |
| 2004/0079648 A1 | 4/2004 | Khan et al. |
| 2004/0161628 A1 | 8/2004 | Gupta et al. |
| 2004/0171280 A1 | 9/2004 | Conley et al. |
| 2005/0003310 A1 | 1/2005 | Bai et al. |
| 2005/0008780 A1 | 1/2005 | Ackerman et al. |
| 2005/0019593 A1 | 1/2005 | Mancini et al. |
| 2005/0053467 A1 | 3/2005 | Ackerman et al. |
| 2005/0085031 A1 | 4/2005 | Lopatin et al. |
| 2005/0126593 A1 | 6/2005 | Budinger et al. |
| 2005/0158590 A1 | 7/2005 | Li |
| 2005/0255329 A1 | 11/2005 | Hazel |
| 2005/0260347 A1 | 11/2005 | Narwankar et al. |
| 2005/0260357 A1 | 11/2005 | Olsen et al. |
| 2005/0271813 A1 | 12/2005 | Kher et al. |
| 2006/0008838 A1 | 1/2006 | Golub et al. |
| 2006/0019032 A1 | 1/2006 | Wang et al. |
| 2006/0019033 A1 | 1/2006 | Muthukrishnan et al. |
| 2006/0021633 A1 | 2/2006 | Harvey |
| 2006/0024734 A1 | 2/2006 | Golub et al. |
| 2006/0029971 A1 | 2/2006 | Golub et al. |
| 2006/0040052 A1 | 2/2006 | Fang et al. |
| 2006/0057630 A1 | 3/2006 | Golub et al. |
| 2006/0062917 A1 | 3/2006 | Muthukrishnan et al. |
| 2006/0084283 A1 | 4/2006 | Paranjpe et al. |
| 2006/0148180 A1 | 7/2006 | Ahn et al. |
| 2006/0153995 A1 | 7/2006 | Narwankar et al. |
| 2006/0228895 A1 | 10/2006 | Chae et al. |
| 2006/0246213 A1 | 11/2006 | Moreau et al. |
| 2006/0286819 A1 | 12/2006 | Seutter et al. |
| 2007/0009658 A1 | 1/2007 | Yoo et al. |
| 2007/0009660 A1 | 1/2007 | Sasaki et al. |
| 2007/0023142 A1 | 2/2007 | LaGraff et al. |
| 2007/0049043 A1 | 3/2007 | Muthukrishnan et al. |
| 2007/0054487 A1 | 3/2007 | Ma et al. |
| 2007/0065578 A1 | 3/2007 | McDougall |
| 2007/0099415 A1 | 5/2007 | Chen et al. |
| 2007/0134518 A1 | 6/2007 | Feist et al. |
| 2007/0202254 A1 | 8/2007 | Ganguli et al. |
| 2007/0259111 A1 | 11/2007 | Singh et al. |
| 2007/0274837 A1 | 11/2007 | Taylor et al. |
| 2008/0032510 A1 | 2/2008 | Olsen |
| 2008/0038578 A1 | 2/2008 | Li |
| 2008/0056905 A1 | 3/2008 | Golecki |
| 2008/0090425 A9 | 4/2008 | Olsen |
| 2008/0113095 A1 | 5/2008 | Gorman et al. |
| 2008/0135914 A1 | 6/2008 | Krishna et al. |
| 2008/0268154 A1 | 10/2008 | Kher et al. |
| 2008/0268635 A1 | 10/2008 | Yu et al. |
| 2009/0004386 A1 | 1/2009 | Makela et al. |
| 2009/0004850 A1 | 1/2009 | Ganguli et al. |
| 2009/0053426 A1 | 2/2009 | Lu et al. |
| 2009/0061613 A1 | 3/2009 | Choi et al. |
| 2009/0098289 A1 | 4/2009 | Deininger et al. |
| 2009/0098346 A1 | 4/2009 | Li |
| 2009/0155976 A1 | 6/2009 | Ahn et al. |
| 2009/0239061 A1 | 9/2009 | Hazel et al. |
| 2009/0269507 A1 | 10/2009 | Yu et al. |
| 2009/0286400 A1 | 11/2009 | Heo et al. |
| 2010/0062149 A1 | 3/2010 | Ma et al. |
| 2010/0062614 A1 | 3/2010 | Ma et al. |
| 2010/0075499 A1 | 3/2010 | Olsen |
| 2010/0110451 A1 | 5/2010 | Biswas et al. |
| 2010/0120245 A1 | 5/2010 | Tjandra et al. |
| 2010/0159150 A1 | 6/2010 | Kirby et al. |
| 2010/0167527 A1 | 7/2010 | Wu et al. |
| 2010/0239758 A1 | 9/2010 | Kher et al. |
| 2010/0252151 A1 | 10/2010 | Furrer et al. |
| 2010/0270609 A1 | 10/2010 | Olsen et al. |
| 2010/0279018 A1 | 11/2010 | Hazel et al. |
| 2011/0175038 A1 | 7/2011 | Hou et al. |
| 2011/0293825 A1 | 12/2011 | Atwal et al. |
| 2012/0024403 A1 | 2/2012 | Gage et al. |
| 2012/0040084 A1 | 2/2012 | Fairbourn |
| 2012/0082783 A1 | 4/2012 | Barnett et al. |
| 2012/0148944 A1 | 6/2012 | Oh et al. |
| 2012/0276306 A1 | 11/2012 | Ueda |
| 2012/0318773 A1 | 12/2012 | Wu et al. |
| 2013/0048605 A1 | 2/2013 | Sapre et al. |
| 2013/0164456 A1 | 6/2013 | Winter et al. |
| 2013/0292655 A1 | 11/2013 | Becker et al. |
| 2014/0103284 A1 | 4/2014 | Hsueh et al. |
| 2014/0264297 A1 | 9/2014 | Kumar et al. |
| 2014/0271220 A1 | 9/2014 | Leggett |
| 2015/0017324 A1 | 1/2015 | Barnett et al. |
| 2015/0184296 A1 | 7/2015 | Xu et al. |
| 2015/0221541 A1 | 8/2015 | Nemani et al. |
| 2016/0010472 A1 | 1/2016 | Murphy et al. |
| 2016/0060758 A1 | 3/2016 | Marquardt et al. |
| 2016/0181627 A1 | 6/2016 | Roeder et al. |
| 2016/0251972 A1 | 9/2016 | Dierberger |
| 2016/0281230 A1 | 9/2016 | Varadarajan et al. |
| 2016/0298222 A1 | 10/2016 | Meehan et al. |
| 2016/0300709 A1 | 10/2016 | Posseme et al. |
| 2016/0328635 A1 | 11/2016 | Dave et al. |
| 2016/0333493 A1 | 11/2016 | Miettinen et al. |
| 2016/0333494 A1 | 11/2016 | Miettinen et al. |
| 2017/0076968 A1 | 3/2017 | Wang et al. |
| 2017/0084425 A1 | 3/2017 | Uziel et al. |
| 2017/0158978 A1 | 6/2017 | Montagne et al. |
| 2017/0159198 A1 | 6/2017 | Miettinen et al. |
| 2017/0213570 A1 | 7/2017 | Cheng et al. |
| 2017/0233930 A1 | 8/2017 | Keuleers et al. |
| 2017/0292445 A1 | 10/2017 | Nelson et al. |
| 2017/0314125 A1 | 11/2017 | Fenwick et al. |
| 2018/0006215 A1 | 1/2018 | Jeong et al. |
| 2018/0105932 A1 | 4/2018 | Fenwick et al. |
| 2018/0127868 A1 | 5/2018 | Xu et al. |
| 2018/0156725 A1 | 6/2018 | Kessler et al. |
| 2018/0261516 A1 | 9/2018 | Lin et al. |
| 2018/0261686 A1 | 9/2018 | Lin et al. |
| 2018/0329189 A1 | 11/2018 | Banna et al. |
| 2018/0339314 A1 | 11/2018 | Bhoyar et al. |
| 2018/0351164 A1 | 12/2018 | Hellmich et al. |
| 2018/0358229 A1 | 12/2018 | Koshizawa et al. |
| 2019/0019690 A1 | 1/2019 | Choi et al. |
| 2019/0032194 A2 | 1/2019 | Dieguez-Campo et al. |
| 2019/0079388 A1 | 3/2019 | Fender et al. |
| 2019/0088543 A1 | 3/2019 | Lin et al. |
| 2019/0130731 A1 | 5/2019 | Hassan et al. |
| 2019/0271076 A1 | 9/2019 | Fenwick et al. |
| 2019/0274692 A1 | 9/2019 | Lampropoulos et al. |
| 2019/0284686 A1 | 9/2019 | Melnik et al. |
| 2019/0284692 A1 | 9/2019 | Melnik et al. |
| 2019/0284693 A1 | 9/2019 | Task |
| 2019/0284694 A1 | 9/2019 | Knisley et al. |
| 2019/0287808 A1 | 9/2019 | Goradia et al. |
| 2019/0311900 A1 | 10/2019 | Pandit et al. |
| 2019/0311909 A1 | 10/2019 | Bajaj et al. |
| 2019/0330746 A1 | 10/2019 | Britz et al. |
| 2019/0382879 A1 | 12/2019 | Jindal et al. |
| 2020/0027767 A1 | 1/2020 | Zang et al. |
| 2020/0043722 A1 | 2/2020 | Cheng et al. |
| 2020/0240018 A1 | 7/2020 | Melnik et al. |
| 2020/0340107 A1 | 10/2020 | Chatterjee et al. |

(56) References Cited

U.S. PATENT DOCUMENTS

| | | |
|---|---|---|
| 2020/0361124 A1 | 11/2020 | Britz |
| 2020/0392626 A1 | 12/2020 | Chatterjee et al. |
| 2021/0292901 A1 | 9/2021 | Knisley et al. |

FOREIGN PATENT DOCUMENTS

| | | | |
|---|---|---|---|
| EP | 0209307 A1 | 1/1987 | |
| EP | 0387113 B1 | 12/1993 | |
| EP | 1431372 A2 | 6/2004 | |
| EP | 1236812 B1 | 5/2006 | |
| EP | 2022868 A2 | 2/2009 | |
| EP | 2103707 A1 | 9/2009 | |
| EP | 2194164 A1 | 6/2010 | |
| EP | 2392895 A1 | 12/2011 | |
| EP | 2161352 B1 | 2/2014 | |
| EP | 3540092 A1 | 9/2019 | |
| FR | 3029835 * | 12/2015 | ............... B32B 5/16 |
| JP | 5-156398 * | 6/1993 | ............ C22C 21/00 |
| JP | 2823086 B2 | 11/1998 | |
| JP | 2001342556 A | 12/2001 | |
| JP | 2003013745 A | 1/2003 | |
| JP | 2003164819 A | 6/2003 | |
| JP | 2006010403 A | 1/2006 | |
| JP | 2006199988 A | 8/2006 | |
| JP | 2016-162599 A * | 9/2016 | ............... H05F 3/04 |
| KR | 20060106104 A | 10/2006 | |
| KR | 20110014989 A | 2/2011 | |
| KR | 101192248 B1 | 10/2012 | |
| KR | 20170063149 A | 6/2017 | |
| KR | 101761736 B1 | 7/2017 | |
| KR | 20170140354 A | 12/2017 | |
| RU | 2630733 C2 | 9/2017 | |
| TW | 201812075 A | 4/2018 | |
| WO | 9631687 A1 | 10/1996 | |
| WO | WO 99/55499 * | 11/1999 | ............ B26B 21/40 |
| WO | 00/09778 A1 | 2/2000 | |
| WO | 2005059200 A1 | 6/2005 | |
| WO | 2014159267 A1 | 10/2014 | |
| WO | 2015047783 A1 | 4/2015 | |
| WO | 2019182967 A1 | 9/2019 | |

OTHER PUBLICATIONS

Water Online brochure "New GE Corrosion Inhibitor Protects Crude Oil and Gas Pipelines". May 4, 2015, 2 pages.*
Taiwan Office Action dated Oct. 7, 2021 for Application No. 109126499.
International Search Report dated Dec. 1, 2021 for Application No. PCT/US2021/046245.
International Search Report and Written Opinion dated Dec. 2, 2021 for Application No. PCT/US2021/045766.
Wang et al., "Hydrogen permeation properties of CrxCy@Cr2O3/Al2O3 composite coating derived from selective oxidation of a Cr—C alloy and atomic layer deposition", International Journal of Hydrogen Energy, 43 (2018) pp. 21133-21141.
Liu et al., "Microstructural evolution of the interface between NiCrAlY coating and superalloy during isothermal oxidation", Materials and Design, 80 (2015) pp. 63-69.
Extended European Search Report dated Feb. 28, 2022 for Application No. 19771810.9.
Partial Supplementary European Search Report dated Feb. 10, 2022 for Application No. 19770951.2.
Taiwan Office Action dated May 10, 2021 for Application No. 109126499.
European Search Report dated Jul. 26, 2021 for Application No. 19793402.9.
International Search Report and Written Opinion dated Sep. 28, 2021 for Application No. PCT/US2021/035874.
Extended European Search Report dated Oct. 4, 2021 for Application No. 19793402.9.
PCT Notification of Transmittal of the International Search Report and the Written Opinion of the International Searching Authority for International Application No. PCT/US2019/019113; dated Jun. 10, 2019; 11 total pages.
Taiwan Office Action dated Apr. 22, 2020 for Application No. 108106406.
Lang "The Role of Active Elements in the Oxidation Behaviour of High Temperature Metals and Alloys" Elsevier, 1989, pp. 111-129 and 153.
International Search Report and Written Opinion dated Jul. 2, 2019 for Application No. PCT/US2019/022788.
International Search Report and Written Opinion for International Application No. PCT/US2019/022737 dated Jul. 2, 2019, 11 pages.
"A Review on Alumina-Chrome (Al2O3-Cr2O3) and Chrome-Silica (Cr2O3-SiO2) Refractories along with their Binary Phase Diagrams," Nov. 18, 2009, 6 pages, <http://www.idc-online.com/technical_references/pdfs/chemical_engineering/A_Review_on_Alumina_Chrome.pdf>.
Bensch et al. "Modeling of the Influence of Oxidation of Thin-Walled Specimens of Single Crystal Superalloys," Superalloys 2012:12th International Symposium on Superalloys, The Minerals, Metals & Materials Society, pp. 331-340, <https://www.tms.org/superalloys/10.7449/2012/Superalloys_2012_331_340.pdf>.
Fujita et al. "Sintering of Al2O3-Cr2O3 Powder Prepared by Sol-Gel Process," Journal of the Society of Materials Science, Japan, vol. 56, No. 6, Jun. 2007, pp. 526-530, <http://www.ecm.okayama-u.ac.jp/ceramics/Research/Papers/2007/Fujita_JSMS56(2007)526.pdf>.
Hirata et al. "Corrosion Resistance of Alumina-Chromia Ceramic Materials against Molten Slag," Materials Transactions, vol. 43, No. 10, 2002, pp. 2561-2567, <https://www.jim.or.jp/journal/e/pdf3/43/10/2561.pdf>.
Knisley et al. "Volatility and High Thermal Stability in Mid to Late First Row Transition Metal Diazadienyl Complexes," Organometallics, 2011, vol. 30, No. 18, pp. 5010-5017.
Pettit et al. "Oxidation and Hot Corrosion of Superalloys," Jan. 1984, The Metal Society AIME, Warrendale, PA, pp. 651-687, <http://www.tms.org/superalloys/10.7449/1984/Superalloys_1984_651_687.pdf>.
Tsai et al. "Growth mechanism of Cr2O3 scales: oxygen and chromium diffusion, oxidation kinetics and effect of yttrium," Materials Science and Engineering A, vol. 212, No. 1, pp. 6-13, 1996, <https://doi.org/10.1016/0921-5093(96) 10173-8>.
He et al. "Role of annealing temperatures on the evolution of microstructure and properties of Cr2O3 films," Applied Surface Science, vol. 357, Part B, Dec. 1, 2015, pp. 1472-1480, <https://doi.org/10.1016/j.apsusc.2015.10.023>.
International Search Report and Written Opinion for International Application No. PCT/US2019/022709 dated Jun. 28, 2019, 13 pages. (APPM/44015337PC).
Kaloyeros et al. "Review-Silicon Nitrtide and Silicon Nitride-Rich Thin Film Technologies: Trends in Deposition Technniques and Related Application". ECS Journal of Solid State Science and Technology, 6 (10) P691-P714 (2017).
Heidary et al. "Study on the behavior of atomic layer deposition coatings on a nickel substrate at high temperature," Nanotechnology, 27, 245701, 2016, pp. 1-32.
Vargas Garcia et al. "Thermal barrier coatings produced by chemical vapor deposition," Science and Technology of Advanced Materials, vol. 4, No. 4, 2003, pp. 397-402.
Dyer et al. "CVD Tungsten Carbide and Titanium Carbide Coatings for Aerospace Components," SAE Transactions, vol. 98, Section 1: Journal of Aerospace (1989), pp. 64-70. Abstract Only.
International Search Report and Written Opinion for International Application No. PCT/US2019/022788 dated Jul. 2, 2019, 9 pages.
International Search Report and Written Opinion dated Jul. 6, 2020 for Application No. PCT/US2020/024285.
Tsai, S.C. et al., "Growth mechanism of Cr2O3 scales: oxygen and chromium diffusion, oxidation kinetics and effect of yttrium", Elsevier, 1996, pp. 6-13.

(56) References Cited

OTHER PUBLICATIONS

Knisley, Thomas J. et al., "Volatility and High Thermal Stability in Mid- to Late-First-Row Transition-Metal Diazadienyl Complexes", American Chemical Society Publications, Aug. 25, 2011, pp. 5010-5017.

Pettit, F.S. et al., "Oxidation and Hot Corrosion of Superalloys", TMS Publications, 1984, pp. 651-687.

International Search Report and Writtne Opinion dated Jul. 2, 2019 for Application No. PCT/US2019/022737.

Kaloyeros, Alain E., et al., "Review-Silicon Nitride and Silicon Nitride-Rich Thin Film Technologies: Trends in Deposition Techniques and Related Applications". ESC Journal of Solid State Science and Technology, 6 (10) P691-P714 (2017).

PCT International Search Report and the Written Opinion for International Application No. PCT/US2019/041181; dated Oct. 25, 2019; 15 total pages.

International Search Report and Written Opinion dated Jun. 24, 2020 for Application No. PCT/US2020/019151.

Liu et al., "Ultrathin high-temperature oxidation-resistant coatings of hexagonal boron nitride" Nature Communications; doi: 10.1038/ncomms3541; Pub. Oct. 4, 2013, 8 pages.

Calderon, "Boron Nitride Growth and Electronics", Cornell University, May 2018.

W. Auwarter, "Hexagonal boron nitride monolayers on metal supports: Versatile templates for atoms, molecules and nanostructures", Surface Science Reports 74 (2019) 1-95.

International Search Report and Written Report dated Jul. 31, 2020 for Application No. PCT/US2020/027247.

International Search Report and the Written Opinion for International Application No. PCT/US2020/028462 dated Jul. 29, 2020, 11 pages.

International Search Report issued to PCT/US2020/028462 dated Jul. 29, 2020.

Leppaniemi, Jarmo, et al., "Corrosion protection of steel with multilayer coatings: Improving the sealing properties of physical vapor deposition CrN coatings with Al2O3/TiO2atomic layer deposition nanolaminates". Thin Solid Films 627 (2017) pp. 59-68.

Ali, Muhammad Rostom, et al., "Electrodeposition of aluminum-chromium alloys from Al&BPC melt and its corrosion and high temperature oxidation behaviors". Electrochimica Acta, vol. 42. No. 15., pp. 2347-2354, 1997.

Wu, Yanlin, et al., "Atomic Layer Deposition from Dissolved Precursors". Nano Letters 2015, 15, 6379-6385.

Johnson, Andrew L., et al., "Recent developments in molecular precursors for atomic layer deposition". Organomet. Chem., 2019, 42, 1-53.

Haukka, Suvi, et al., "Chemisorption of chromium acetylacetonate on porous high surface area silica". Applied Surface Science, vol. 75, Issues 1-4, Jan. 2, 1994, pp. 220-227. Abstract Only.

International Search Report and Written Opinion dated Oct. 30, 2020 for Application No. PCT/US2020/041382.

Taiwan Office Action dated Dec. 21, 2020 for Application No. 109113600.

International Search Report and Written Opinion dated Feb. 2, 2021 for Application No. PCT/US2020/056618.

\* cited by examiner

PROTECTION OF COMPONENTS FROM CORROSION

CROSS-REFERENCE TO RELATED APPLICATIONS

The application is a divisional of U.S. application Ser. No. 16/283,567, filed Feb. 22, 2019, which claims priority to U.S. Appl. No. 62/663,633, filed Apr. 27, 2018, and to U.S. Appl. No. 62/726,795, filed Sep. 4, 2018, incorporated by reference in their entirety herein.

BACKGROUND

Field

Embodiments of the present invention generally relate to a protective coating for turbine blades and other components exposed to corrosive environments.

Aerospace components are fabricated from stainless steel, superalloys, and aluminum. Corrosion may occur in various modes, high temperature hot corrosion (HTHC), low temperature hot corrosion (LTHC), and oxidation. Corrosion may occur on blade faces as well as on blade shanks, turbine disk rims, and other components exposed to corrosive environments.

Description of the Related Art

Aerospace components including turbine vanes and blades are fabricated from nickel and cobalt-based superalloys. Superalloy protection during engine operation employs a plurality of layers, including a stable oxide scale that is dense, adheres to the surface or surfaces of the component, and is stable at high temperatures up to about 1900° C. Various barrier coatings, including thermal barrier coatings (TBC), can be used to inhibit oxidation and corrosion of the aerospace components. Various materials are employed to form these corrosion-resistant coatings, such as native-grown oxides include $Cr_2O_3$ for hot corrosion protection and $Al_2O_3$ for oxidation resistance. TBCs and other barrier coatings can be deposited using either e-beam PVD or thermal spray. Deposited TBCs include yttria-stabilized zirconia, gadolinium zirconate, tantalum-yttrium zirconium oxides, and other mixed zirconate, halfnate, silicate, and aluminate compounds. However, environmental contaminants, e.g., calcium-magnesium-aluminum-silicon oxide systems ("CMAS"), can lead to corrosion of the TBCs.

Thus, there remains a need in the art for coatings with enhanced corrosion resistance, including enhanced CMAS corrosion resistance.

SUMMARY

Discussed herein are embodiments of protecting superalloy structures from corrosion. In one example, a multilayered coating structure includes a thermal barrier coating (TBC) layer formed on a superalloy structure; and a metal oxide layer formed on the TBC layer via atomic layer deposition (ALD). The metal oxide layer includes at least one of a rare earth metal, aluminum, zirconium, chromium, or combinations thereof. The metal oxide layer can be from 1 nm to 3 microns thick and can have a variation in the thickness of +/−50%.

In an example method of inhibiting corrosion, the method includes: performing a controlled release of a material comprising a dissolved or suspended metal into an engine environment during engine operation, the metal being one or more of a lanthanide, aluminum, or iron. A plurality of foreign matter is present in at least one of: the engine environment in a gaseous phase or as an aerosol, or one or more engine surfaces. The method further includes converting the plurality of foreign matter into a solid phase comprising the released material in response to the material released during the performing of the controlled release contacting the plurality of foreign matter.

In an example, a multilayered coating structure includes: a structure formed from a superalloy, wherein the structure formed from the superalloy is defined by an outside surface comprising a plurality of apertures, wherein a plurality of internal gas passages are formed through the superalloy structure to connect at least some of the apertures; and a thermal barrier coating (TBC) layer formed over an outside surface of the structure formed from the superalloy. The multilayered coating structure further includes a metal oxide layer formed via ALD on the TBC layer and inside the plurality of internal gas passages and comprises a rare earth metal, aluminum, zirconium, chromium, or combinations thereof.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only exemplary embodiments and are therefore not to be considered limiting of its scope, and may admit to other equally effective embodiments.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

Figure 1A:
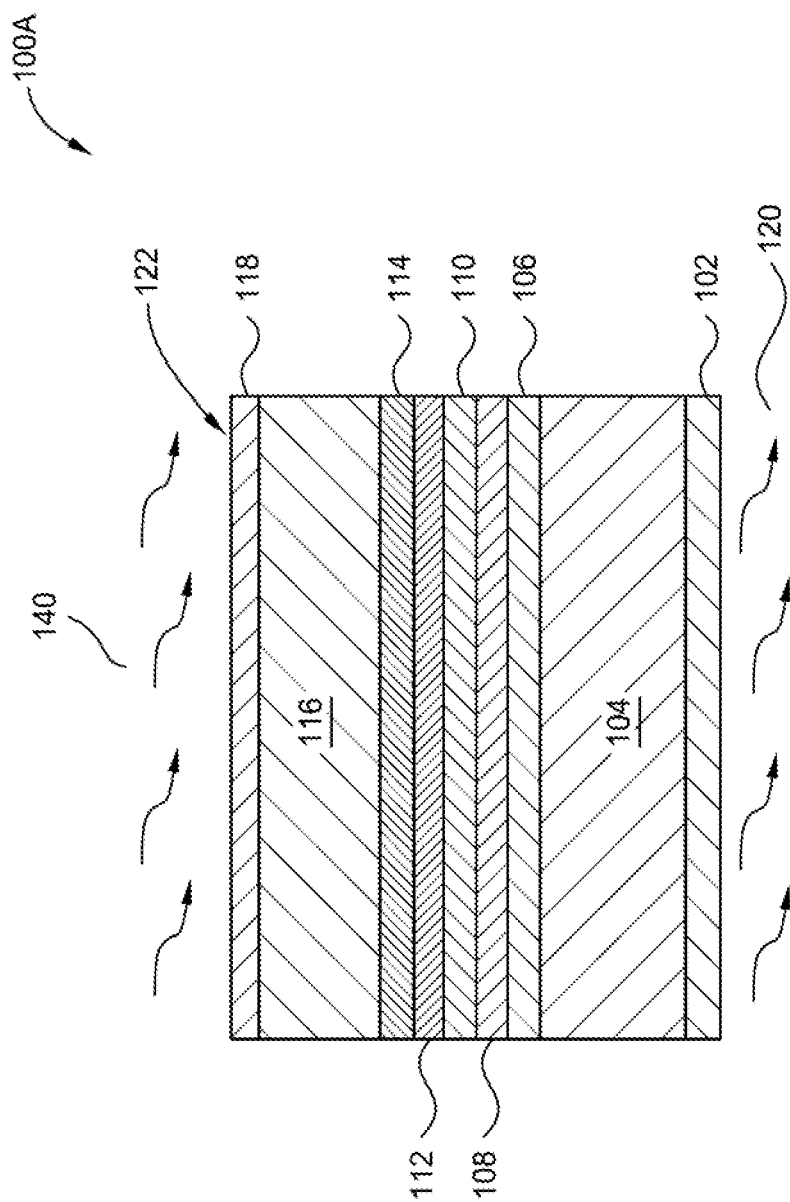
FIG. 1A is a cross-section of a hot engine section component according to embodiments of the present disclosure.

The systems and methods discussed herein provide improved resistance to calcium-magnesium-aluminum-silicon oxide systems ("CMAS") corrosion. CMAS is present in the natural environment of engines including aerospace engines in a variety of forms, including volcanic ash, sand particulates, dust, and in fuel. CMAS is a highly reactive composition that both chemically and mechanically attacks surfaces through corrosion, chemical reaction, and infiltration. CMAS, as well as other particulates and contaminates collectively referred to herein as "foreign matter," can also enter the engine environment. The term "engine environment" can be used herein to refer to a space in which an engine operates, including a region in which the engine is located and the spaces among and between engine components in the hot and cool air paths discussed herein. The term "engine environment" can be used herein to refer to a space in which an engine operates, including a region in which the engine is located and the spaces among and between engine components in the hot and cool air paths discussed herein. The term "engine environment" is thus used herein to describe a zone or a plurality of zones that are not on surfaces of engine components where CMAS can occur as coatings break down. Foreign matter that has not, or in some cases has not yet, settled on the engine components in a molten or solid state can be present in the engine environment. CMAS can corrode engine coatings made from YSZ, GZO, and other oxides and engine parts made from superalloys. For example, when the engine operation causes the foreign matter to be pulled through porous coatings, intended to protect the underlying engine component, towards the engine component. The corrosion can occur when CMAS settles on the parts while in a molten phase or a solid phase. The gaseous phase of CMAS can include a molten material or a particulate material.

In one example, the CMAS protection discussed herein can be in the form of a protective coating that is applied at an original equipment manufacturer (OEM) on newly cast or machined aerospace engine components. In another example, the CMAS protection can be in the form of a protective coating that is formed and/or repaired or replaced during refurbishment. During refurbishment, the aerospace components can be assembled or disassembled, and, in some examples, the engine may be operated during some or part of the refurbishment process, including when the protective coating is formed. The protection from CMAS corrosion can further be in the form of foreign matter interception during engine operation when the foreign matter such as CMAS is in the engine environment and/or on the surface of one or more engine components.

In examples where a protective coating is formed, the metal oxide protective coating can be referred to as a protective coating herein and can also be formed at an OEM on newly fabricated components and on assembled engine components while the engine is in use, with or without disassembling the engine and/or removing previous coatings. Using the systems and methods herein, engine components are protected from CMAS corrosion by forming and/or refurbishing a protective coating ("coating"), and/or by intercepting CMAS contaminants when present in the engine environment in gaseous or solid states. The improved corrosion resistance is provided by the CMAS interception, and/or the protective OEM coating, as well as by the refurbishment process of repairing/reapplying the protective coating. The interception and/or protection from CMAS corrosion maintains and improves the adhesion, stability, and coating structure of the superalloy components.

In some examples herein, during OEM coating or refurbishment, the protective coatings employed herein are fabricated using atomic layer deposition (ALD) or chemical vapor deposition (CVD). In one example, ALD is employed to form layered thin metal oxide protective coatings of 3 microns (3,000 nm) or less in thickness using one or more deposition cycles discussed herein. In some embodiments, the metal oxide protective coatings are formed using one or more rare earth elements such as cerium (Ce), dysprosium (Dy), erbium (Er), europium (Eu), gadolinium (Gd), holmium (Ho), lanthanum (La), lutetium (Lu), neodymium (Nd), praseodymium (Pr), promethium (Pm), samarium (Sm), scandium (Sc), terbium (Tb), thulium (Tm), ytterbium (Yb), or yttrium (Y). In some embodiments, the metal oxide protective coatings are formed using one or more of aluminum (Al), silicon (Si), hafnium (Hf), zirconium (Zr), tantalum (Ta), iron (Fe), or titanium (Ti). In one example, the metal oxide protective coatings are referred to as original equipment manufacturer (OEM) coatings when the coatings are applied to newly fabricated components that have not been previously coated, assembled, and/or used in an engine. In other examples, the metal oxide protective coatings are refurbishment coatings, formed on components that were previously coated with the same or different metal oxide protective coatings and which have been used in assembled engines. In some examples, the metal oxide protective coatings formed at the OEM can be removed after use of the coated components and replaced to preserve and extend the operational life of the coated component. In other examples, a new metal oxide protective coating is formed over existing coatings, for example, thermal barrier coatings as discussed herein, without removing the previous underlying coating(s). The protective coatings can be formed on various layers including oxides, Gd-zirconates ($Gd_2Zr_2O_7$ "GZO"), and yttria-stabilized zirconia (YSZ) deposited via electron beam physical vapor deposition (EB-PVD), the YSZ can have a columnar grain structure.

In an example where CMAS is intercepted during engine operation, the interception can occur when CMAS or other foreign material is present in the engine environment and/or on a predetermined schedule via the release of a material into the engine. The interception of the CMAS in the atmosphere of the engine (e.g., the engine environment) can prevent the CMAS from landing on engine components. The CMAS can be present in the engine environment in a gaseous or aerosol phase that may include a molten material or a particulate material. By intercepting the CMAS in a gaseous phase or an aerosol phase, the CMAS is prevented from contributing to engine corrosion since it is neutralized by the reaction with a material released in the engine during operation. In this example, a material such as a precursor can be included in hydrocarbon fuel, and the fuel can be released to intercept CMAS in the engine environment as well as CMAS that may be on the components in molten or solid form. In some embodiments, the precursor includes one or more rare earth elements such as cerium (Ce), dysprosium (Dy), erbium (Er), europium (Eu), gadolinium (Gd), holmium (Ho), lanthanum (La), lutetium (Lu), neodymium (Nd), praseodymium (Pr), promethium (Pm), samarium (Sm), scandium (Sc), terbium (Tb), thulium (Tm), ytterbium (Yb), or yttrium (Y). In some embodiments, the precursor can include one or more of aluminum (Al), silicon (Si), hafnium (Hf), zirconium (Zr), tantalum (Ta), iron (Fe), or titanium (Ti), alone or in combination, or in combination with one or more rare earth elements. The hydrocarbon fuel including the precursor, which can be dissolved in solution or suspended as metal particulate, reacts with the CMAS in various states to neutralize its corrosive effects.

Figure 1B:
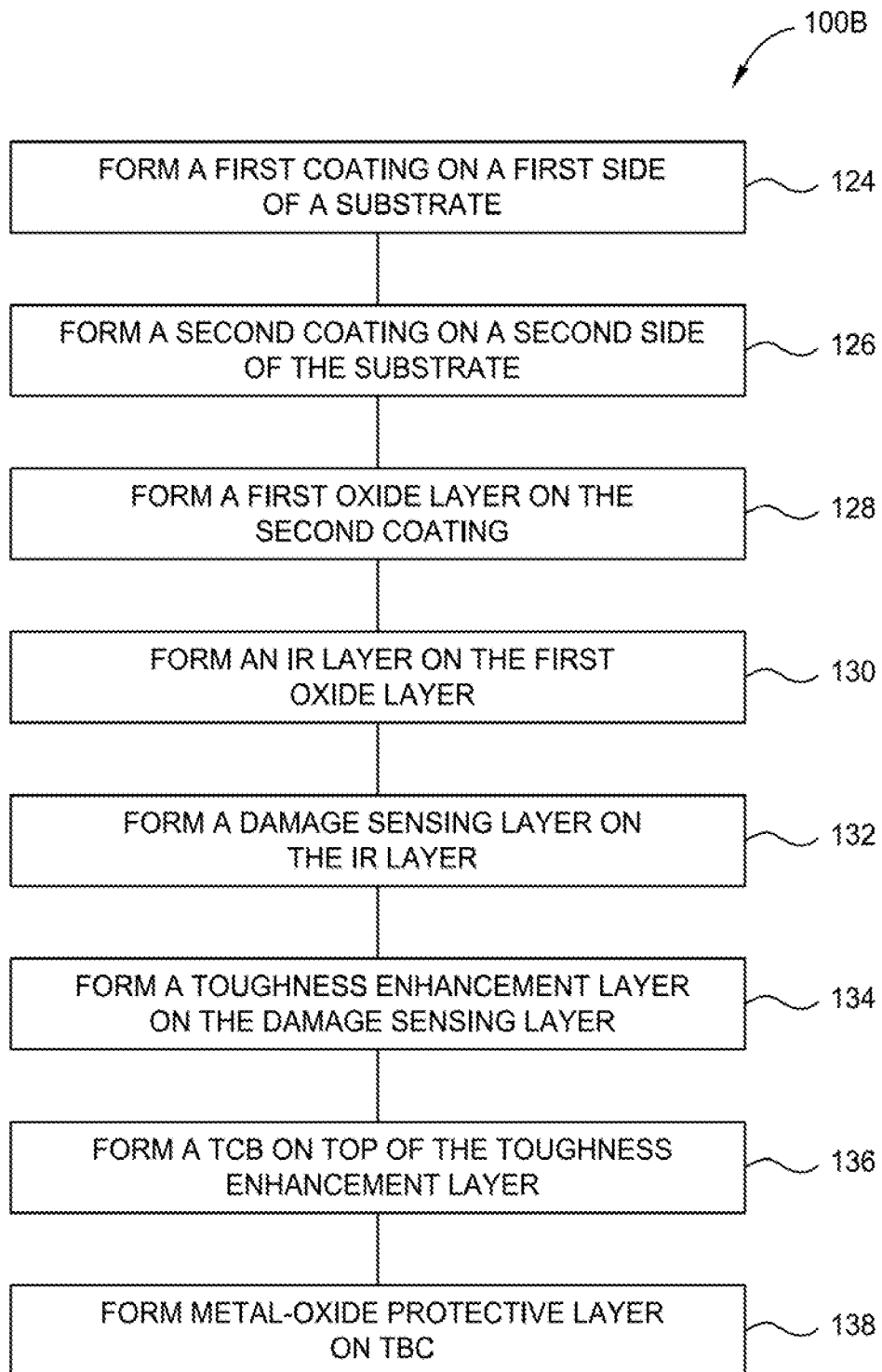
FIG. 1B is a method flow diagram of an example fabrication method for the component in FIG. 1A according to embodiments of the present disclosure.

FIG. 1A is a cross-section of a hot engine section component 100A according to embodiments of the present disclosure. FIG. 1B is a method flow of an example fabrication method 100B for the component in FIG. 1A. FIGS. 1A and 1B are discussed together below. FIG. 1A is a partial schematic cross section of the example hot engine section component 100A. The hot engine section component 100A is shown in a partial view which includes an internal channel 120 where cooling air is flowed during engine use. The hot engine section component 100A is further defined by an outside surface 122 where a gas mixture 140 that can be from 1200° C. to 2000° C. degrees is flowed during engine use. The metal oxide protective coating discussed herein is a conformal coating that extends over the outside surfaces as well as the inside of channels and passages. The various surfaces on which the metal oxide protective coating is formed are referred to collectively as a "substrate" herein. The metal oxide protective coatings discussed herein can have a variation in thickness uniformity of +/−50%. In an embodiment, a substrate 104 as discussed herein is a portion of the three dimensional hot section engine component 100A. The substrate 104 is coated on a first side with an internal corrosion protection layer 102. The substrate 104, while illustrated as a flat portion in FIG. 1A, can be a hot engine section component that has edges, corners, curves, and transitional surfaces. The substrate 104 can further includes a plurality of apertures that lead to interior passages (collectively represented as the internal channel 120), and other features that can be exposed to CMAS corrosion. In an embodiment, the substrate 104 can further have a bond coating layer 106 formed on a side of the substrate opposite of the internal corrosion protection layer 102. The bond coating 106 can be formed to a thickness from about 10 microns to about 100 microns and fabricated from MCrAlX where M is cobalt (Co), nickel (Ni), or combinations thereof, and X is platinum (Pt), Y, Hf, Si, Ti, or combinations thereof. In another embodiment, the bond coating 106 is fabricated from platinum and aluminum. Turning to the fabrication method 100B of FIG. 1B, the internal corrosion protection layer 102 can be formed by ALD or CVD at operation 124. Operation 124 can occur in an ALD or CVD chamber under vacuum at temperatures about less than 900° C. and, in some examples, less than about 500° C. The bond coating layer 106 can be formed by cathodic arc deposition or by CVD at operation 126.

Further in the hot engine section component 100A, a first oxide layer 108 is formed on the bond coating 106, and an infrared (IR) reflector layer 110 is formed over the first oxide layer 108. The first oxide layer 108 is formed to a thickness from 1 micron to 10 microns at operation 128 via thermal oxidation or CVD. The IR reflector layer 110 can be a ceramic layer formed by e-beam or physical vapor deposition (PVD) at operation 130. The IR reflector layer 110 can be formed as one or more layers to a total thickness from about 13 microns to about 1,000 microns. A damage sensing layer 112 is formed over the IR reflector layer 110, for example, by e-beam PVD at operation 132. Further, at operation 134, a toughness enhancing layer 114 is formed to a thickness of between about 5 microns and 50 microns over the damage sensing layer 112 by e-beam PVD. The damage sensing layer 112 can be formed to a thickness from about 1 micron to about 120 microns, and can be fabricated from yttrium aluminum garnet (YAG) or yttrium stabilized zirconium. In some examples, the damage sensing layer 112 further includes either of which can also one or more rare earth metal dopants such as europium (Eu), terbium (Tb), or dysprosium (Dy).

In an embodiment, the toughness enhancing layer 114 includes yttria-stabilized zirconia. A thermal barrier coating (TBC) layer 116 is formed over the toughness enhancing layer 114 at operation 136. The TBC layer 116 can be a porous layer, and contaminants including CMAS can be pulled into the pores of the TBC layer 116, compromising the integrity of the one or more underlying layers including the superalloy. The TBC layer 116 includes an oxide such as gadolinium (Gd)-doped zirconate (GZO) or yttria-stabilized zirconia (YSZ). In alternate embodiments, the TBC layer 116 includes erbium-doped YSZ, YbGd—YSZ, $NdZrO_2$, $Yb_4Zr_3O_{12}$, or oxides containing Ce, Nd, Sm, Dy, Yb, Sc, or Lu, or other oxides or combinations of oxides. In at least an example where the TBC layer 116 is YSZ, the TBC layer 116 is deposited by e-beam PVD with columnar grain structure at operation 136. The TBC layer 116 has a thickness from 100 microns to 2 mm, and in alternate embodiments, has a thickness from 150 microns to 500 microns.

At operation 138, a protective coating layer including a metal oxide is formed over the TBC layer. The protective coating layer formed at operation 138 is shown in FIG. 1A as protective coating layer 118. The protective coating layer 118 is employed to inhibit CMAS corrosion on the TBC layer 116 and is formed as one or more conformal layers over the TBC layer 116, and can be formed in the pores of the TBC layer 116. In one example, a thickness in the uniformity of the protective coating layer 118 can vary by up to +/−50%. The protective coating layer 118 can form an outside surface 122 of the structure of the hot engine section component 100A and is thus in contact with a hot gas path. In various embodiments, the protective coating layer 118 is formed via ALD or CVD to a thickness from 1 nm to 3 microns. The protective coating layer 118 includes one or more metal oxides such as $Al_2O_3$, $Cr_2O_3$, $ZrO_2$, $La_2O_3$, $HfO_2$, or $Gd_2O_3$. In alternate embodiments, other rare earth elements or combinations of metal oxides can be employed to form the protective coating layer 118. The protective coating layer 118 can be a conformal coating that is further formed in interior passages and surfaces including the internal channel 120, as well as external surfaces of engine components as discussed herein.

Figure 2:
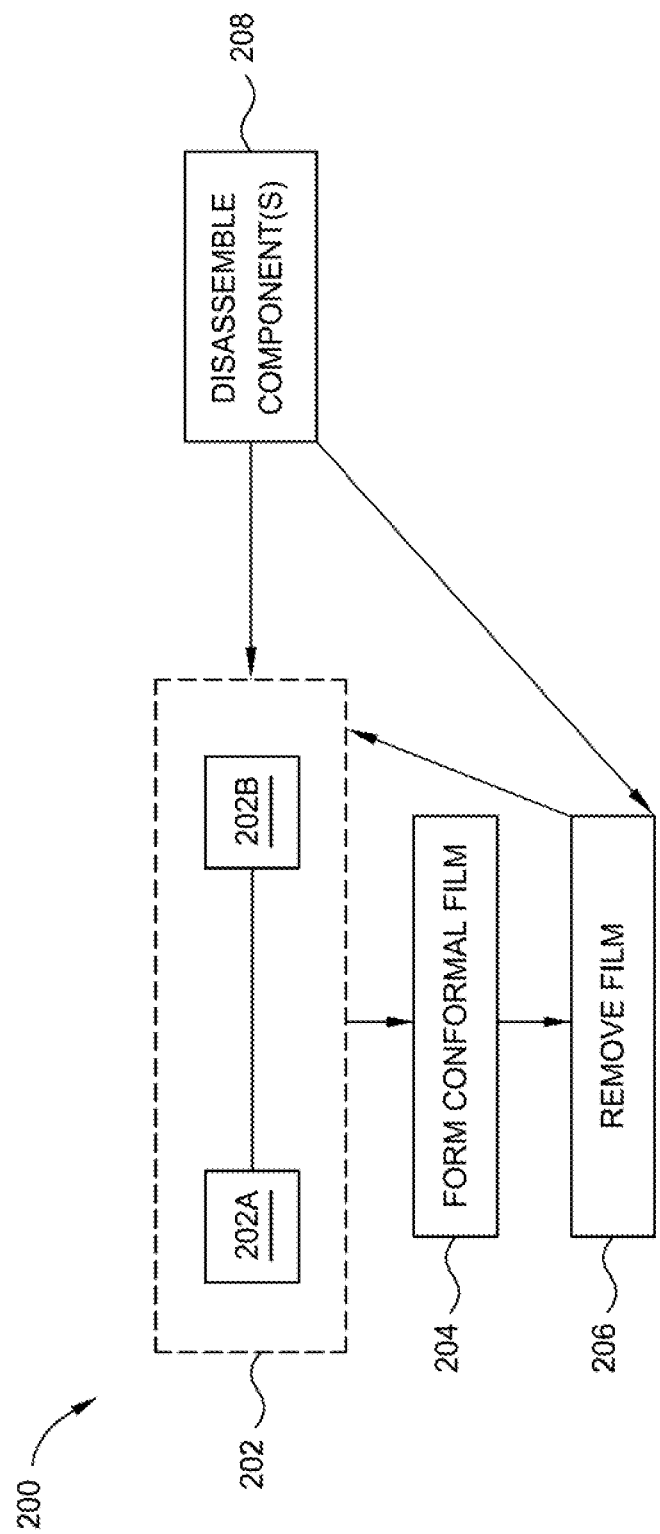
FIG. 2 is a method of forming a corrosion-resistant protective coating on a substrate according to embodiments of the present disclosure.

FIG. 2 is a method 200 of forming a corrosion-resistant protective coating on a substrate such as a hot section engine component according to embodiments of the present disclosure. In operation 202 of the method 200, a substrate is exposed to a plurality of precursors via an ALD process or a CVD process. The substrate at operation 202 can be heated to a temperature from about 900° C. to about 1300° C. prior to exposure to the precursors. In an alternate embodiment, operation 202 occurs via chemical vapor deposition (CVD). In that example, both the metal precursor and the oxidizer are introduced simultaneously, in contrast to the layer-by-layer deposition of ALD operations. The substrate can be a coating on a hot section engine component, such as a GZO coating or an YSZ coating. In an example of ALD at operation 202, which is a layer-by-layer process, during a first portion 202A of operation 202, a metal-organic precursor is introduced to a substrate. The precursor includes a metal that can be a rare earth metal, or that can include Al, Si, Hf, Zr, Ta, Ti, or alloys or combinations thereof. In a second portion 202B of operation 202, which can occur simultaneously with the first portion 202A or after a predetermined delay from 4 seconds to about 60 seconds, an oxidizer is introduced to the substrate to form a protective coating at operation 202 from 1 nm to 3 microns thick. In an example where operation 202 is performed using an ALD system, a plurality of cycles of 202A-202B are executed to form the layer at operation 204. A time in between the first portion 202A and the second portion 202B can be shortened via a pump cycle to reduce a pressure in the process chamber, followed by a purge to replace the reactive compound with inert gas. The protective coating formed at operation 204 is a conformal protective coating, formed on all exposed surfaces of the substrate, including interior passages and surfaces as well as external surfaces. Thus, operation 204 is completed when the plurality of cycles 202A-202B, which can be from 2 cycles to 100 cycles, are completed. Each cycle of 202A-202B forms a single layer of metal oxide protective coating on the substrate, each cycle deposits from about 0.5 Å to about 1.2 Å per cycle, to a total thickness of less than 3 microns formed at operation 204. The protective coating formed at operation 204 can include a stoichiometric formula such as, $Al_2O_3$, $Cr_2O_3$, $ZrO_2$, $La_2O_3$, $HfO_2$, or $Gd_2O_3$. The protective coating is a conformal coating with an average thickness having a variation of less than +/−25%. In an embodiment, the protective coating formed at operation 204 increases a mass of the substrate (e.g., of a hot section engine component) 1% or less than 1%.

In one example, operation 202 can be repeated more than once to form separate layers of coatings. In this example, a first layer including a first composition and a first thickness is formed by a plurality of 202A-202B cycles. Subsequently, a second layer including a second composition and a second thickness is formed by a second plurality of 202A-202B cycles. During use of the assembled coated components, or during a subsequent annealing operation prior to assembly, the heat from use causes migration of the first and second layers to form a coating layer on top of a TBC layer. This coating layer can have a graded composition depending upon the composition and relative thicknesses of the first and second layers. A total thickness of the layer formed at operation 204 when more than one layer is employed for the coating is up to 3 microns.

In an embodiment, the metal precursor can include a rare earth metal, aluminum, zirconium, chromium, iron, or combinations thereof. The metal oxide protective coating either reacts with the CMAS to reduce and/or prevent the CMAS infiltration into the thermal barrier coating, providing CMAS resistance to the substrates (e.g., the underlying TBC coating) which would otherwise have a lower resistance to CMAS. The protective coating formed at operation 204 is formed as a conformal coating over the substrate, including inside of passages and channels as discussed herein. The protective coating can vary in thickness+/−50%, and can be formed inside some or all of the pores of the porous TBC coating which further improves the corrosion resistance of the engine component(s). At operation 206, the protective coating formed at operation 204 can be removed after use of the component associated with the substrate, e.g., when the substrate is a blade from an engine. The engine can be disassembled and the protective coatings can be removed from the components at operation 208. The protective coating can be subsequently re-formed at operations 202-204. In another example, operation 206 is optional, and the engine components can be used, disassembled, and re-coated at operations 202-204 without the removal of the protective coating at operation 206.

In an embodiment, the substrate at operation 202 is a new component used in a hot section of an engine, such as a blade or a vane, which has never been part of an assembled engine or other device prior to method 200. In an alternate embodiment, the substrate at operation 202 is a hot engine section component that was previously coated via method 200. In this example, method 200 can further include, at operation 208, prior to the exposure to precursors at operation 202, disassembling one or more hot engine section components prior to exposure to the precursors at operation 202. Subsequent to disassembly at operation 208, which can include a plurality of operations and equipment, the hot engine section components (e.g., substrates) can undergo the metal oxide protective coating formation at operations 202-204. In some examples, the disassembled components can have the coating removed at operation 206 prior to protective coating formation at operations 202-204. The removal at operation 206 can be performed using, for example, fluorine and/or chlorine ions to selectively etch previously applied coatings without damaging the underlying TBC layer or other layers protecting the superalloy. That is, depending upon the embodiment, previously formed metal oxide protective coatings may or may not be removed in whole or in part prior to formation of a protective coating layer during refurbishment.

Figure 3:
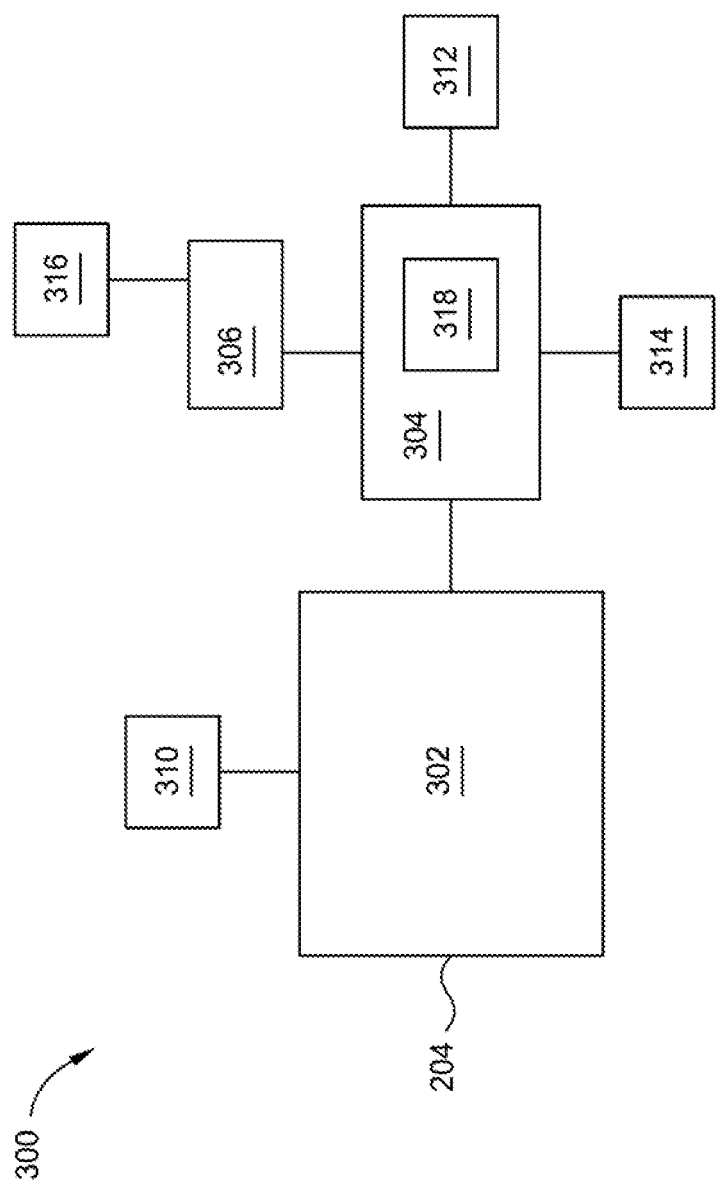
FIG. 3 is a schematic illustration of a system to coat a plurality of hot section engine components or other components while an engine is in operation according to embodiments of the present disclosure.

FIG. 3 is a schematic illustration of a system 300 to coat a plurality of hot section engine components while an engine is in operation. The system 300 shows an example engine 302 and a gas injection system 304. The gas injection system 304 is fluidly coupled to the engine 302, and includes a valve and gas distribution system that includes a showerhead or other gas injector (not shown here) to distribute a precursor stored in a vessel 306. The vessel 306 can be an ampule or other storage vessel capable of storing a metal precursor that forms the protective coating layer 118 in FIG. 1. The gas injection system 304 is coupled to a controller 312 and can be coupled to a power source 314. In an embodiment, a clock 318 can be coupled to the gas injection system 304 can be configured to send a signal to the controller 312 at predetermined intervals to execute instructions to release the precursor from the vessel 306. In alternate embodiments, a signal to the controller 312 is received from one or more sensors 310 coupled to the engine 302. These sensors 310 can include infrared sensors, particle size sensors, laser light scattering equipment, mass spectrometers, introscopy equipment, or combinations of sensors and related equipment. The controller 312 is further configured to adjust a pressure at which the vessel 306 releases the precursor and a temperature of the gas injection system 304. In one example, a temperature of the precursor from the vessel 306 is modified by the temperature of the gas injection system 304. The gas injection system 304 can be coupled to a fluid conduit (not shown) such that the precursor is fed into the engine along with a plurality of fuel. In another example, the vessel 306 has a separate controller 316 to regulate temperature and/or pressure of the precursor. In one example, the gas injection system 304 can have active temperature control to maintain gas line temperature above a condensation temperature of the metal oxide but below a decomposition temperature. The gas line temperature is the temperature of the gas as it flows from the vessel 306 to the gas injection system 304 or from the gas injection system 304 to the engine 302. The operation of the system 300 is discussed below in FIG. 4.

Figure 4:
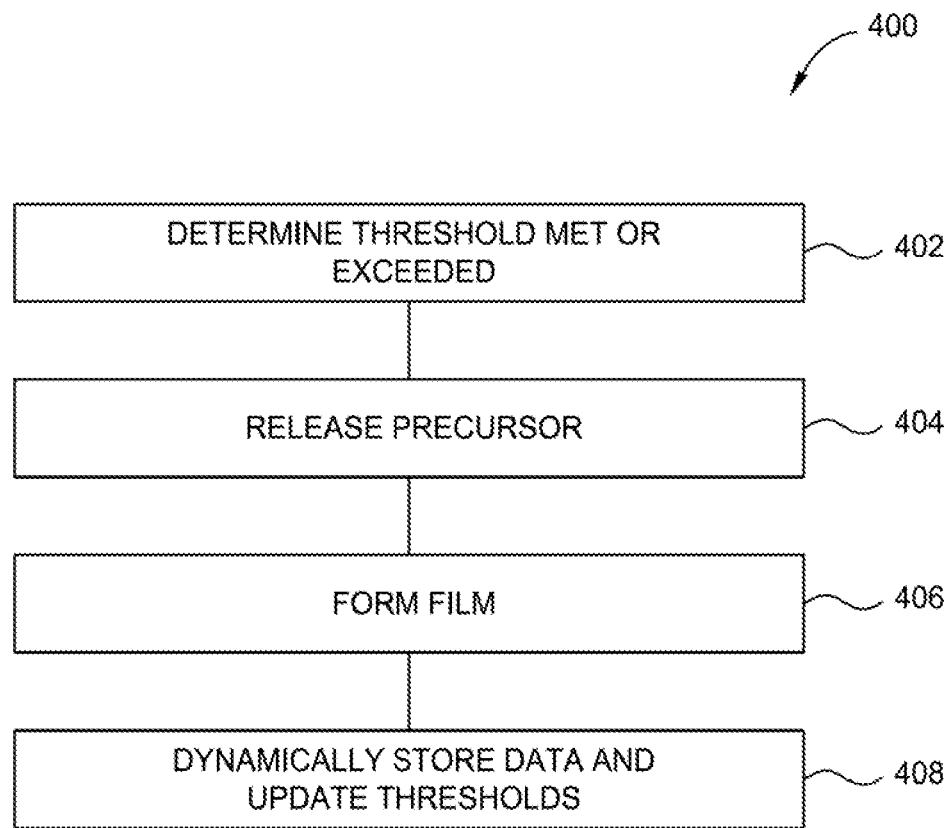
FIG. 4 is a method of in-situ formation of a corrosion-resistant protective coating on a substrate according to embodiments of the present disclosure.

FIG. 4 is a flow chart of a method 400 of refurbishing a plurality of engine components in-situ during use of the engine. The engine use discussed herein with respect to repair and refurbishment can be coated while in commercial use (e.g., while in flight) or while in use during maintenance and/or quality control operations. Thus, the engine is operated either outside of the aircraft in which it is typically used or is operated during a maintenance test and not while the aircraft is in flight and is coated during this use. In one example, the method 400 begins after operation 204 in the method 200 of FIG. 2, such that a plurality of engine components is coated with a metal oxide protective coating of less than 3 microns in thickness. In other examples, the method 400 can be performed on engine components that were not previously coated with the metal oxide protective coating discussed herein. At operation 402 of the method 400, an engine including the plurality of coated engine components is in operation in either a commercial or a test environment. Further at operation 402, a clock coupled to the gas injection system (which can be similar to the gas injection system 304 in FIG. 3) or an at least one sensor coupled to the engine determines that a predetermined threshold has been exceeded. The sensors 310 can include infrared sensors, particle size sensors, laser light scattering equipment, mass spectrometers, introscopy equipment, or combinations of sensors and related equipment. In some examples, the sensors 310 can be configured to determine that a thickness of the protective coating is below a predetermined threshold associated with a material property. Thus, the predetermined threshold can include one or more of a material property such as light refraction or particle size, or a time period. In an embodiment, the one or more sensors 310 are configured to transmit a signal to a controller such as the controller 312 from FIG. 3, when a predetermined threshold is met or exceeded, depending upon the embodiment.

At operation 404, subsequent to the determination at operation 402 that at least one predetermined threshold has been exceeded and in response to receiving a signal, the controller causes a metal precursor to be released into the engine from a gas storage vessel coupled to a gas injection system. The gas injection system can be similar to the gas injection system 304 in FIG. 3, and is coupled to the engine, for example, to a fuel line such that the precursor mixes with the fuel during injection. Duration of precursor release at operation 404 can be determined by the type of signal received at operation 402. The gas storage vessel can be similar to the vessel 306 in FIG. 3. At operation 406, in response to the release of the plurality of components at operation 404, a metal oxide protective coating is formed on the exposed surfaces of the engine. The protective coating is formed as a conformal coating on both outside surfaces of the engine components as well as internal passages and channels of the engine components. The protective coating can be further formed inside pores of a porous coating, such as the TBC layer discussed herein, overlying the substrate. The metal oxide protective coating can be formed up to a micron in thickness and is formed on the internal passages as well as the external surfaces of the engine components. This in-situ repair of the protective coating in the method 400 saves on repair costs and time since it does not involve disassembly and reassembly of the engine, nor is the existing protective coating removed. In an embodiment, at operation 408, performance data and repair data associated with the sensor detections and related signals, as well as information associated with the type and duration of precursor release, can be stored. The stored data can be analyzed on a periodic basis in order to dynamically update and store the predetermined thresholds discussed herein.

In one example, at operation 404, the precursor is released in response to a determination at operation 402, based on a signal from the clock (such as the clock 318 in FIG. 3) that a predetermined time period has been exceeded. This predetermined time period can include a duration of engine operation, a time since formation of the metal oxide protective coating, or other time periods or combinations of time periods associated with engine fabrication and use.

Figure 5:
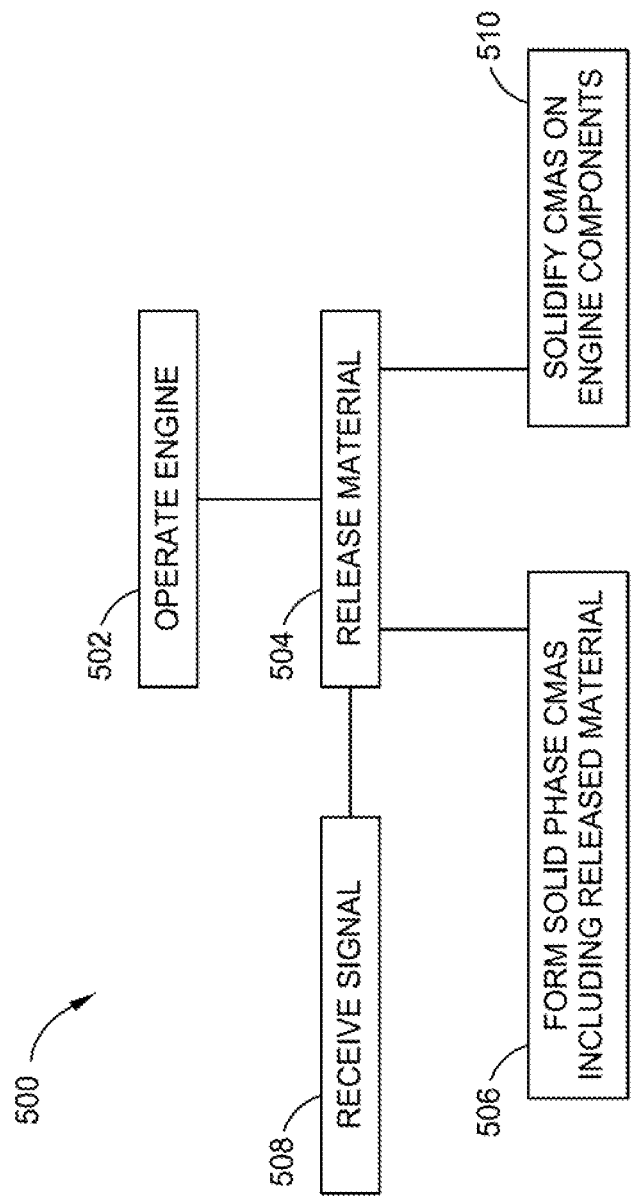
FIG. 5 is a method of protecting engine components from CMAS corrosion according to embodiments of the present disclosure.

FIG. 5 is a method 500 of protecting engine components from CMAS corrosion. In contrast to the method 400 discussed above and shown in FIG. 4, the method 500 can intercept CMAS on engine parts in molten or solid form, and can also intercept CMAS in gaseous or aerosol form in the engine environment. In the method 500, at operation 502, an engine is operated during flight or other use, such as during quality control or maintenance operations. At least some of the components of the engine are formed from nickel superalloys and have one or more coatings formed thereon that can include the protective coating discussed herein as an OEM or refurbishment coating. In alternate embodiments, some or all of the engine components do not include the protective coating.

At operation 504, during operation of the engine, a material is released into the engine from a compartment such as a fuel tank or other compartment configured to store a material comprising a metal-containing material. The metal-containing material, referred to herein as a precursor, includes one or more rare earth metal and can further include one or more of a lanthanide, aluminum, zirconium, chromium, iron, gadolinium, or combinations thereof. In an embodiment, the release of material at operation 504 can include a controlled release of material. A controlled release of material can include the release of material at operation 504 using a predetermined flow rate for a predetermined time period, depending upon a plurality of factors including engine size, type, make, model, or one or more signals received at operation 508 as discussed herein. In one example, the release of the precursor at operation 504 can be in response to a predetermined scheduled as discussed herein. The release of the precursor can thus be triggered at operation 504 by a signal received from a sensor such as a clock or other timing device at operation 508. In an embodiment, the signal is transmitted on a predetermined schedule at operation 508 when a time of the clock is associated with one or more times of day or durations of operation of the engine as compared to a predetermined schedule of time(s).

In another example, the release of the material at operation 504 occurs in response to a signal received at operation 508 during the operation of the engine in response to detection of foreign matter. In this example, the signal received at operation 508 can indicate that foreign matter such as CMAS or other damaging particulate matter is present in the engine in a concentration or for a period of time outside of a predetermined threshold. The metal-containing material can be dissolved completely or partially in a solvent such as a fuel, e.g., a hydrocarbon fuel suitable for use with turbine engines. A concentration of metal containing material in the solution can be from about 0.1% to about 25% mass concentration. In other examples, the metal containing material can be present as part of a suspension, and can be present at a concentration from about 0.1% to about 5% mass concentration. The release at operation 504 can occur for a predetermined time period and/or until a predetermined volume of material has been released. In one example, the predetermined time period can be based on a period of engine operation, such that operation 504 occurs for X % of a time of engine operation, or after a predetermined period of operation. The clock sensor discussed above can be set according to one or more time-based material-release triggers as discussed herein.

At operation 506, a reaction between CMAS in the engine and the material released at operation 504 converts CMAS, which is in a gaseous or aerosol phase that may include a molten material or a particulate material, into a solid phase including the metal-containing material. The reaction at operation 504 shifts (raises) the eutectic point of the CMAS such that it has a melting point high enough to withstand temperature of engine operation up to 2000° C. The solid phase of CMAS formed at operation 506 does not get pulled into the porous surface(s) of the engine components, and contains the metal-containing material. The corrosive effect of the CMAS on the engine parts is thus mitigated.

In various examples, the sensor can include, in addition to or instead of the clock discussed above, an infrared sensor, a particle-size detector, or combinations thereof. In this example, in response to the release of the material at operation 504, at operation 510, during the operation of the engine, the CMAS or other foreign matter in the engine environment reacts with the precursor. The reaction at operation 510 solidifies CMAS in the molten phase surface(s) of the engine components and/or reacts with CMAS in the solid phase at operation 510. In some examples, the solidification of the CMAS upon its reaction with the material can be said to form a protective coating at operation 510 by solidifying molten CMAS or by reacting with the solid phase CMAS to neutralize the corrosive effects. The protective coating can be formed from 1 nm to 3 microns thick.

The CMAS corrosion inhibition discussed herein can thereby occur through the interception of CMAS in the engine environment or on engine components, or by forming and refurbishing metal oxide coatings, or combinations thereof. The protective metal oxide coatings discussed herein provide metal-rich interfaces such as a Gd or La-based coatings that react with the CMAS to reduce or stop infiltration of the CMAS to layers including the TBC layer. The metal oxide coatings further provide CMAS resistance to lower-resistance materials such as the YSZ, thus increasing their efficacy. In one example, a Gd-containing precursor is deposited from gaseous/liquid metal organic precursor onto heated substrate of GZO or YSZ, with exposure to oxidant simultaneously or at a finite time interval after exposure to the Gd precursor in a process chamber. The heated substrate can be at an OEM or can be a previously coated assembled or disassembled component. In an example of in-situ deposition, a plurality of hot section engine components are coated (or re-coated) with the metal oxide protective coating while the engine. The engine can be in use either during a flight or during quality control or maintenance operations. This in-situ repair creates a commercially viable protective coating repair method, reducing costs and downtime while improving engine performance.

Although various embodiments which incorporate the teachings of the present invention have been shown and described in detail herein, those skilled in the art can readily devise many other varied embodiments that still incorporate these teachings.

What is claimed is:

1. A method of inhibiting corrosion, comprising:
   performing a controlled release of a material comprising a metal-containing precursor into an engine environment during engine operation, wherein the metal-containing precursor comprises a metal selected from aluminum, iron, one or more lanthanides, or combinations thereof, and wherein a plurality of foreign matter is present:
      within the engine environment in a gaseous phase or as an aerosol,
      on one or more engine surfaces, or
      both; and
   contacting the plurality of foreign matter and the metal-containing precursor and converting the plurality of foreign matter into a solid phase comprising the metal in response to the material released during the performing of the controlled release.

2. The method of claim 1, wherein the material further comprises a hydrocarbon fuel.

3. The method of claim 2, wherein the hydrocarbon fuel is released continuously during a predetermined period of engine operation and coats a plurality of pores of a porous coating on the one or more engine surfaces.

4. The method of claim 3, wherein the porous coating is a thermal barrier coating (TBC) layer.

5. The method of claim 4, wherein the TBC layer comprises Gd-zirconates (GZO) or yttria-stabilized zirconia (YSZ).

6. The method of claim 5, wherein the TBC layer has a thickness of about 100 microns to about 500 microns.

7. The method of claim 1, wherein the metal-containing precursor is a dissolved or suspended in the material.

8. The method of claim 1, further comprising;
   receiving, by a sensor coupled to the engine, during operation of the engine, a signal indicating that the plurality of foreign matter is present, wherein the performing of the controlled release of the material is in response to receiving the signal; and
   forming, during operation of the engine, on a plurality of surfaces of the engine, a metal oxide coating, in response to the converting the plurality of foreign matter.

9. The method of claim 8, wherein the sensor comprises a clock, an infrared sensor, a particle-size detector, or combinations thereof.

10. The method of claim 9, wherein the signal is transmitted on a predetermined schedule when the clock is associated with one or more times of day or durations of operation of the engine.

11. The method of claim 8, wherein the material further comprises a rare earth metal, aluminum, zirconium, chromium, or combinations thereof.

12. The method of claim 8, wherein the metal oxide coating has a thickness of about 1 nm to about 3,000 nm.

13. The method of claim 8, wherein the metal oxide coating is formed over a thermal barrier coating (TBC) layer comprising an oxide.

14. The method of claim 13, wherein the TBC layer comprises Gd-zirconates (GZO) or yttria-stabilized zirconia (YSZ).

15. The method of claim 13, wherein the TBC layer has a thickness of about 100 microns to about 500 microns.

16. A method of inhibiting corrosion, comprising:
   performing a controlled release of a material comprising a metal-containing precursor into an engine environment during engine operation, wherein the metal-containing precursor comprises a metal selected from aluminum, iron, one or more lanthanides, or combinations thereof, and wherein a plurality of foreign matter is on one or more engine surfaces;
   contacting the plurality of foreign matter and the metal-containing precursor and converting the plurality of foreign matter into a solid phase comprising the metal in response to the material released during the performing of the controlled release;
   receiving, by a sensor coupled to the engine, during operation of the engine, a signal indicating that the plurality of foreign matter is present, wherein the performing of the controlled release of the material is in response to receiving the signal; and
   forming, during operation of the engine, on a plurality of surfaces of the engine, a metal oxide coating, in response to the converting the plurality of foreign matter.

17. The method of claim 16, wherein the sensor comprises a clock, an infrared sensor, a particle-size detector, or combinations thereof.

18. The method of claim 17, wherein the signal is transmitted on a predetermined schedule when the clock is associated with one or more times of day or durations of operation of the engine.

19. The method of claim 16, wherein the material further comprises a rare earth metal, aluminum, zirconium, chromium, or combinations thereof.

20. The method of claim 16, wherein the metal oxide coating has a thickness of about 1 nm to about 3,000 nm.

* * * * *